US009107296B2

(12) United States Patent
Perez-Uria et al.

(10) Patent No.: US 9,107,296 B2
(45) Date of Patent: Aug. 11, 2015

(54) THERMO/ELECTRICAL CONDUCTOR ARRANGEMENT FOR MULTILAYER PRINTED CIRCUIT BOARDS

(75) Inventors: Igor Perez-Uria, Jarfalla (SE); Per Ferm, Taby (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 0 days.

(21) Appl. No.: 14/122,661

(22) PCT Filed: Jun. 1, 2011

(86) PCT No.: PCT/SE2011/050680
§ 371 (c)(1),
(2), (4) Date: Nov. 26, 2013

(87) PCT Pub. No.: WO2012/166028
PCT Pub. Date: Dec. 6, 2012

(65) Prior Publication Data
US 2014/0085034 A1    Mar. 27, 2014

(51) Int. Cl.
*H05K 1/02* (2006.01)
*H01F 5/00* (2006.01)
*H05K 3/40* (2006.01)

(52) U.S. Cl.
CPC .............. *H05K 1/0206* (2013.01); *H01F 5/00* (2013.01); *H05K 1/0207* (2013.01); *H05K 3/4046* (2013.01); *H05K 2201/086* (2013.01); *H05K2201/10295* (2013.01); *H05K 2201/10303* (2013.01)

(58) Field of Classification Search
CPC .................. H01F 5/00; H01F 27/00–27/30
USPC ............... 336/55–62, 200, 232; 361/760–766
See application file for complete search history.

(56) References Cited

U.S. PATENT DOCUMENTS

| 5,973,923 | A  | * | 10/1999 | Jitaru | ........................... 361/704 |
| 6,469,486 | B1 |   | 10/2002 | Jitaru | |
| 8,415,791 | B2 | * | 4/2013  | Tsukada et al. | ............... 257/735 |
| 8,785,245 | B2 | * | 7/2014  | Kim | ............................. 438/108 |
| 2010/0027228 | A1 |   | 2/2010  | Tsukada et al. | |

FOREIGN PATENT DOCUMENTS

| EP | 0378211 | 7/1990 |
| EP | 1791407 | 5/2007 |
| EP | 1962567 | 8/2008 |
| WO | WO-99/62105 | 12/1999 |

OTHER PUBLICATIONS

PCT Notification of Transmittal of the International Search Report and the Written Opinion of the International Searching Authority, International Application No. PCT/SE2011/050680, (Feb. 15, 2012), 10 pages.

* cited by examiner

*Primary Examiner* — Tuyen Nguyen
(74) *Attorney, Agent, or Firm* — Nicholson de Vos Webster & Elliott, LLP

(57) ABSTRACT

The present invention relates to a thermo/electrical conductor arrangement for multilayer printed circuit boards (PCBs). Using vias for the transport of heat from the interior of the PCB and for conducting high currents between the conducting layers have limitations. Via platings are very thin and vias filled with solder is an unreliable method as there is always a risk that the vias are not properly filled during the soldering process. The present invention overcomes this by inserting a pin of a current conductive material (such as copper) into the via so that the pin is brought into galvanic contact with the conducting layers in the PCB and where at least one end of the pin is freely protruding from the PCB thereby allowing the pin to conduct heat from the interior of the PCB to the protruding end of the pin for external cooling.

6 Claims, 5 Drawing Sheets

THERMO/ELECTRICAL CONDUCTOR ARRANGEMENT FOR MULTILAYER PRINTED CIRCUIT BOARDS

CROSS-REFERENCE TO RELATED APPLICATIONS

This application is a National stage of International Application No. PCT/SE2011/050680, filed Jun. 1, 2011, which is hereby incorporated by reference.

TECHNICAL FIELD

The present invention relates to a thermo/electrical conductor arrangement for multilayer printed circuit boards, PCBs.

BACKGROUND

Modern and cost effective design of electronic devices requires denser packaging of the electronic components on the printed circuit boards PCBs. Denser packaging also requires more effective current- and thermo-management design. In power electronics such as DC-DC converters, multilayer PCBs are often used where conductive layers (such as copper layers) embedded in the PCB carry high currents. These high currents require cooling of the interior of the PCB in addition to the cooling of the individual electronic components mounted on the exterior. The high currents also need to be transported between different copper layers which mean that some copper layers need to be galvanic interconnected.

There are several established methodologies according to standards and best practice techniques:
- The use of high thermo conductive laminates to enhance the thermal transport.
- Use of plated copper vias, through holes across the multilayer structure for current transport. The vias could be unfilled or filled for example with solder.
- Use of thermo conductive packages by the means of gap fillers, tapes, adhesives, chassis etc for thermal transport.

High thereto conductive laminates are often unsuitable for electronics that require high potential isolation. Increased high potential isolation requires enhanced dielectric components (laminates, coatings, etc) which are in contradiction with the characteristics for high thereto conductive laminates.

Using vias for the transport of high currents have limitations. The thickness for the copper layers on a PCB can easily be available up to 0.175 mm but the thickness of the via plating is limited to 0.05 mm which limits the conductivity. Vies properly filled with solder increases current and thermal conductivity between the copper layers, but provide very limited cooling of the interior of the PCB. In addition, filling vies with solder is an unreliable method. Due to different factors there is always a risk that the vies are not properly filled during the soldering process. Thin via platings and partly filled vies limit the possibilities to conduct heat and high currents thru a multilayer structure in a PCB. Gap fillers, tapes and adhesives limit the mounting freedom in the final assembly e.g. lead-free surface mounting profiles and specific chassis add significant costs to the design.

The European patent application with the publication number 0 378 211 discloses a multilayer PCB with a component that has pins penetrating the conductive layers of the PCB. The inventive concept in EP 0 378 211 is mainly to transfer heat generated in the component to a conductive layer in the PCB but do also allow for the transfer of heat from a conductive layer to the pins of a low heat chip. This is however normally not desired as it can result in that the low heat component becomes overheated which degrades performance.

SUMMARY

With this background it is the object of the present invention to obviate at least some of the disadvantages mentioned above.

The object is achieved by a multilayer PCB with one or several vias penetrating a plurality of conductive layers in the PCB and a pin of a current conductive material inserted into each via so that the pin is brought into galvanic contact with the conducting layers. At least one end of the pin is freely protruding from the PCB thereby allowing the pin to conduct heat from the interior of the PCB to the protruding end for external cooling. The pins could optionally be provided with a fin and mounted in an array and subject to forced air cooling.

The invention does also include a transformer implemented in the multilayer PCB comprising one or several transformer copper windings. The windings are conductive layers embedded in the PCB. One or several vies with pins penetrate one or several windings and the pins are brought into galvanic contact with the windings. At least one end of the pin is freely protruding from the PCB thereby allowing the pin to conduct heat from the interior of the transformer to the protruding end of the pin.

The invention has several advantages. It provides a very cost effective, compact and flexible thermal and high current conductor arrangement for electronic devices with PCBs having a dense electronics packaging. The pins can both conduct heat from the interior of the PCB and high currents between the embedded conducting layers. The vies and pins require very little space on the PCB surface but provide large cooling areas and they can be flexible mounted close to hot spots (such as embedded transformers). The pins can be solitary mounted or mounted in arrays or in other formations suitable for each design. The protruding end(s) of the pin for cooling can also easily be arranged to fit the assembly of mounted components. The inserted pin also eliminates the risk of having isolated gaps, a problem with solder filled vias. The pins do also have the additional technical effect of reinforcing the PCB, which is useful when the PCB is subject to stress and vibrations. The possibility to use pins with standard dimensions also makes the mounting cost effective.

The invention will now be described in more detail and with preferred embodiments and referring to accompanying drawings.

DETAILED DESCRIPTION

Figure 1A:
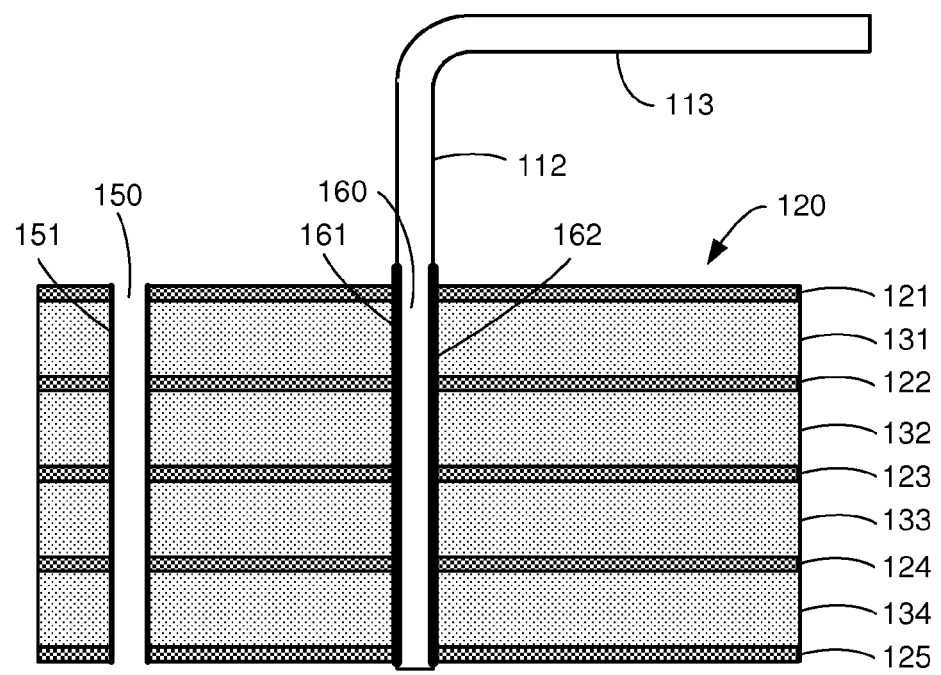
FIGS. 1A to 3 are block diagrams illustrating embodiments of a PCB with current conducting pins according to the present invention.

FIG. 1A illustrates a multilayer PCB 120 with five conductive layers (such as copper layers) 121-125 and four nonconductive layers, substrate layers 131-134. The PCB 120 comprises two through-holes, vias 150,160 penetrating the PCB 120 including the copper layers 121-125 and the substrate layers 131-134. Each via 150,160 is plated on its inner side 151,161 preferably with gold.

In the second via 160, a pin 112 of a current conductive material (preferably a copper pin plated with tin or gold) is inserted. The upper end of the pin 112 is freely protruding from the PCB 120. The purpose of the protruding end of the pin 112 is to act as an external cooling device so that heat from the interior of the PCB 120 is transported by the pin 112 and dissipated from the protruding end of the pin 112. In the embodiment in FIG. 1A the pin 112 is also extended with a low profile cooling fin 113 for increased cooling. In FIG. 1A the fin 113 extends substantially in parallel with the surface of the PCB 120 but it can be positioned in any direction or height that best fits the layout and which gives the optimum cooling. The fin 113 can be an integral part of the pin 112 as in FIG. 1A or a separate fin element as described more in detail further below. The pin 112 can optionally be soldered 162 to the via 160 in a surface mounted reflow operation (pin-in-paste).

Figure 1B:
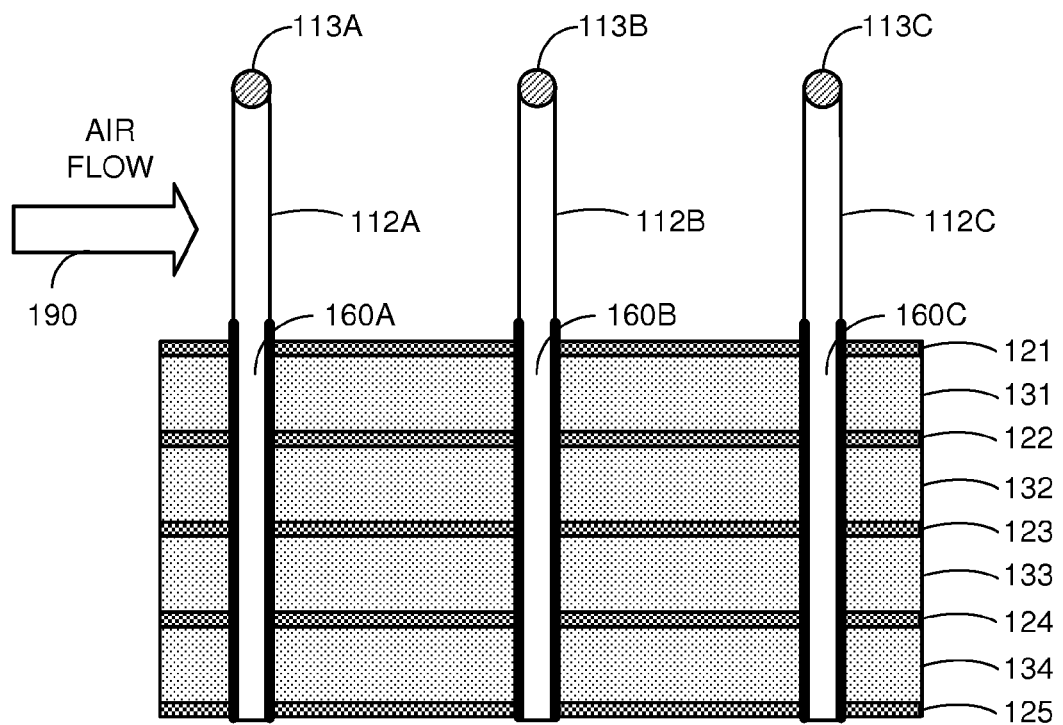

A plurality of pins 112 can be arranged in an array as illustrated in a side view in FIG. 1B. In FIG. 1B the array comprises three vies 160A-C with pins 112A-C each having a fin 113A-C that is positioned so that it can be cooled by a forced air flow 190.

Figure 2A:
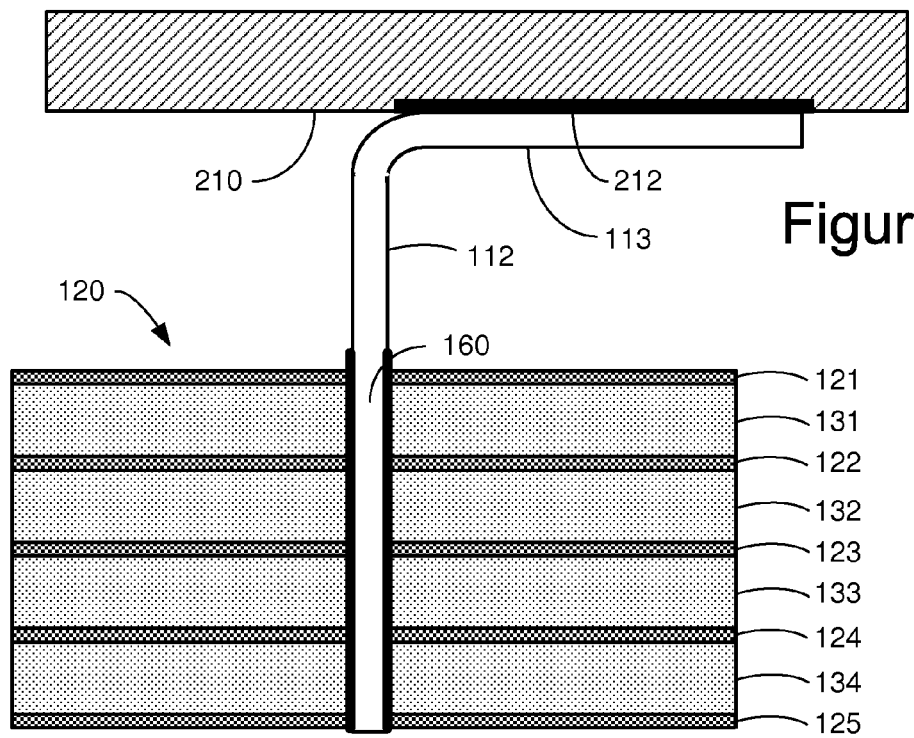
Figure 2B:
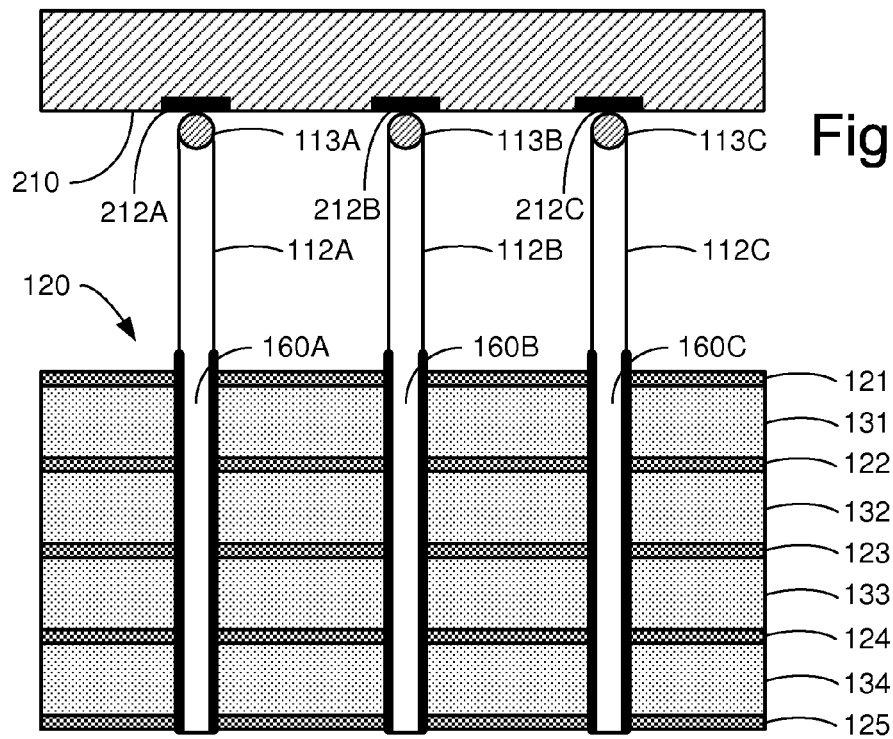

FIGS. 2A and 2B illustrate the same pins 112, 112A-C as in FIGS. 1A and 1B but where the fins 113, 113A-C are attached to a heat sink 210. The heat sink 210 can be an IMS, Insulated Metal Substrate such as an aluminum plate with laminated dielectric having a adapted copper pattern, having a plurality of pads 212,212A-C that are brought in thermal contact with the fins 113A-C. The IMS can be further mounted on the chassis housing the PCB 120.

The pins 112A-C and fins 113A-C have in FIGS. 15 and 2B a round cross-section. They can also have a square cross section and can for example be square connector pins with a typical diameter 0.5 mm for 0.6-0.7 mm vias.

Figure 3:
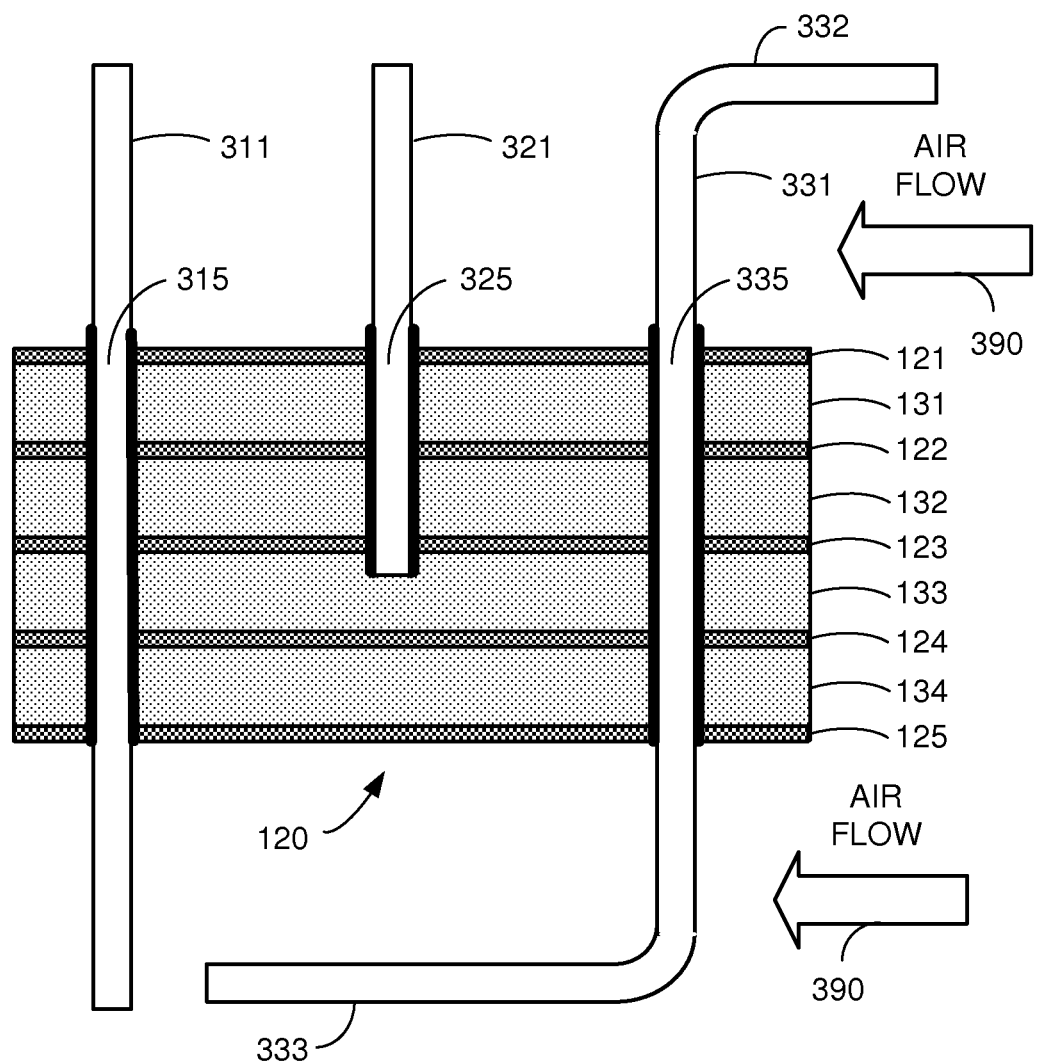

FIG. 3 illustrates three embodiments of current conductive pins 311,321,331. Pin 311 is inserted in a via 315 in the PCB 120 and both ends are protruding from opposite sides of the PCB 120. Pin 321 is inserted in a via 325 that only penetrates a part of the PCB 120. Pin 331 is inserted in a via 335 and where both ends of the pin 331 are protruding from opposite sides. In this embodiment each end is also provided with a fin 332,333 which are cooled by an air flow 390 at both sides of the PCB 120.

Figure 4A:
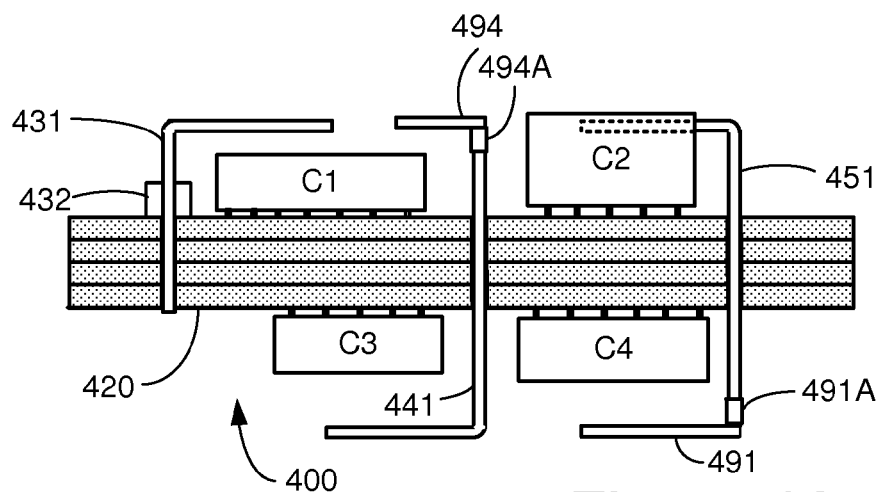
FIGS. 4A and 4B are block diagrams illustrating a PCB with a plurality of current conducting pins according to the present invention.

A typical application of the invention is illustrated in FIGS. 4A and 45. FIG. 4A illustrates an electronic device 400 comprising a multilayer PCB 420. FIG. 45 illustrates the same device 400 but seen from above. On the PCB 420 six electronic components C1-C6 and three configurations of pins 431,441,451 are mounted. Configuration 431 comprises an array of pins that are hold together by a mounting element 432. The mounting element 432 and the array of pins 431 could together be fitted into one element in advance and mounted on the PCB 420 in a single step. Configuration 441 comprises a pin that protrudes from both sides of the PCB 420. The upper part of the pin is also provided with a comb shaped fin element 494. In configuration 451 the bottom part of pin is provided with a simple fin element 491. As can be seen from FIGS. 4A and 4B, the configurations 431,441,451 occupy very small areas on the PCB surface but can be arranged to provide large cooling areas above and between the components C1-C6 at the electronic device 400.

The fin element can have different shapes in order to provide optimal cooling for different electronic design. Some examples are shown in FIG. 4C. The different fin elements 491-494 are separate elements that can be manufactured in advance and mounted on the protruding ends of the pins after the pins have been inserted into the vies. Each fin element 491-494 has a current conducting fitting element 491A-494A adapted to make it easy to mount each fin element 491-494 on the protruding end of the pin.

Figure 5:
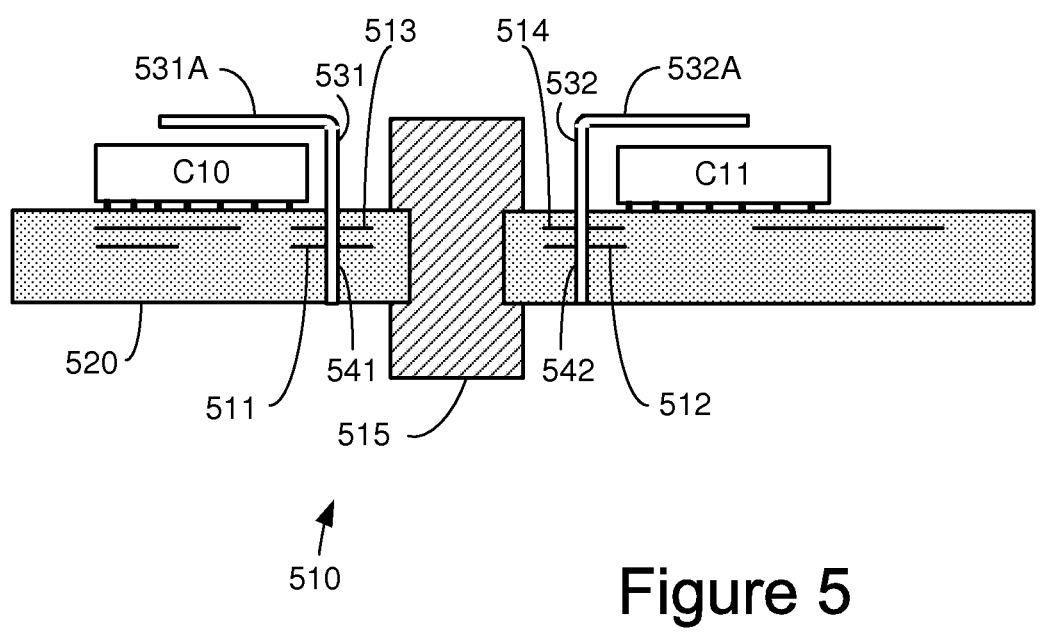
FIG. 5 is a block diagram illustrating a transformer with windings embedded in the PCB and current conducting pins according to the present invention.

In some electronic devices, transformers are integrated in the multilayer PCB where paths of the embedded copper layers in the PCB act as transformer windings. An example of this is illustrated in FIG. 5. FIG. 5 illustrates a transformer 510 integrated in a multilayer PCB 520 having a ferrit core 515 and embedded transformer windings 511-514. These types of transformers can be provided with one or several vias and pins arranged according to any of the embodiments described above.

The transformer 510 in FIG. 5 has two current conducting pins 531,532 (with fins 531A,532A) that are inserted in the vias 541,542 penetrating the windings 511,513 and 512,514, respectively so that the pins 531,532 are brought in galvanic contact with the windings. The pins 531,532 can both conduct high currents between the windings 511,513 and 512,514 respectively and heat from the interior of the transformer 510. Again, the vias 541,542 and the pins 531,532 occupy a very little area on the surface of the PCB 520 but provide a large cooling area above the transformer 510 and the other components C10,C11.

The invention claimed is:

1. A multilayer printed circuit board (PCB) comprising:
   at least one via penetrating a plurality of conductive layers in the PCB;
   at least one pin of a current conductive material, wherein the at least one pin is inserted into the at least one via so that the at least one pin is brought into galvanic contact with conducting layers, and wherein at least one end of the at least one pin is freely protruding from the PCB thereby allowing the at least one pin to conduct heat from an interior of the PCB to the protruding end, and wherein the freely protruding end of the pin is provided with a cooling fin that extends in parallel with a surface of the PCB.

2. The PCB as in claim 1, wherein the at least one pin is soldered to the conductive layers.

3. The PCB as in claim 2, wherein the cooling fin is a separate element having a fitting part adapted so that the fin element can be mounted on the end of the pin.

4. The PCB as in claim 3, wherein the at least one via is penetrating the whole PCB, and wherein two ends of the at least one pin are protruding from opposite sides of the PCB.

5. The PCB as in claim 4, having a plurality of vias and pins arranged in an array.

6. The PCB as in claim 5, further comprising a transformer with at least one transformer copper winding being a path of the conductive layers, and wherein the at least one pin penetrates the at least one transformer copper winding.

* * * * *

UNITED STATES PATENT AND TRADEMARK OFFICE
CERTIFICATE OF CORRECTION

PATENT NO. : 9,107,296 B2  Page 1 of 1
APPLICATION NO. : 14/122661
DATED : August 11, 2015
INVENTOR(S) : Perez-Uria et al.

It is certified that error appears in the above-identified patent and that said Letters Patent is hereby corrected as shown below:

IN THE SPECIFICATION

In Column 1, Line 41, delete "thereto" and insert -- thermo --, therefor.

In Column 1, Line 45, delete "thereto" and insert -- thermo --, therefor.

In Column 1, Line 50, delete "Vies" and insert -- Vias --, therefor.

In Column 1, Line 53, delete "vies" and insert -- vias --, therefor.

In Column 1, Line 54, delete "vies" and insert -- vias --, therefor.

In Column 1, Line 56, delete "vies" and insert -- vias --, therefor.

In Column 2, Line 22, delete "vies" and insert -- vias --, therefor.

In Column 2, Line 33, delete "vies" and insert -- vias --, therefor.

In Column 3, Line 24, delete "vies" and insert -- vias --, therefor.

In Column 3, Line 35, delete "FIGS. 15" and insert -- FIGS. 1B --, therefor.

In Column 3, Line 49, delete "and 45." and insert -- and 4B. --, therefor.

Figure 4B:
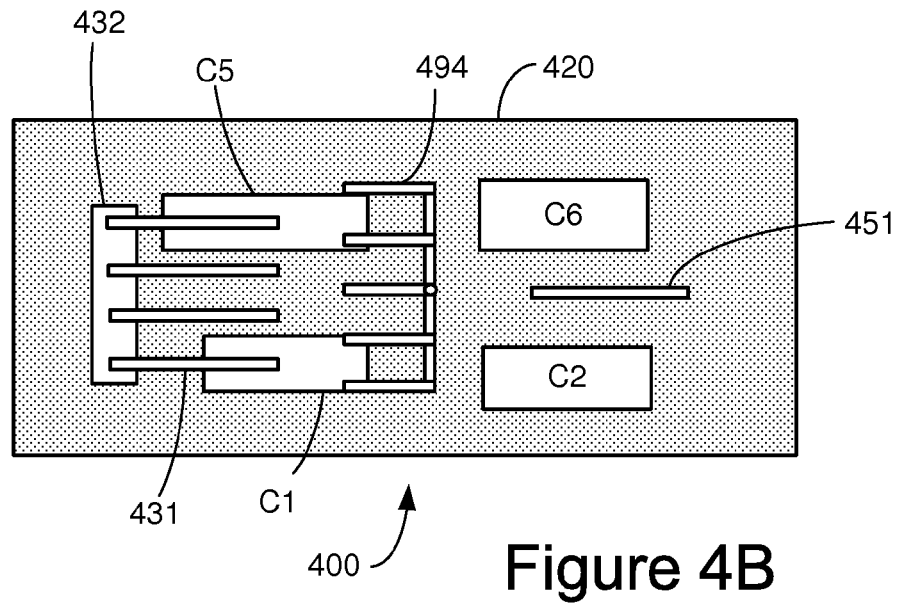
Figure 4C:
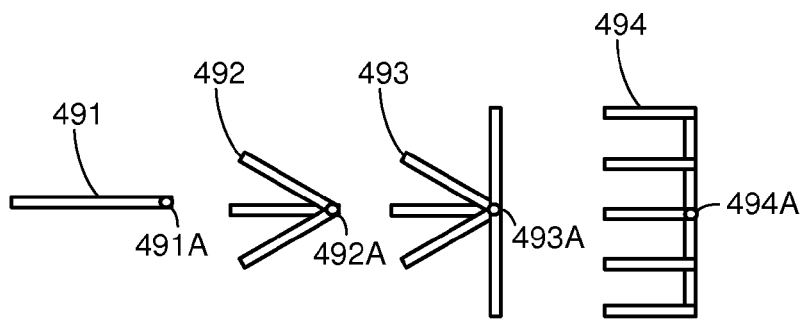
FIG. 4C is a block diagram illustrating different types of cooling fin elements.

In Column 3, Line 50, delete "FIG. 45" and insert -- FIG. 4B --, therefor.

In Column 4, Line 9, delete "vies." and insert -- vias. --, therefor.

In Column 4, Lines 22-32, delete "The transformer.......C10,C11." and insert the same at Line 21, after "above." as a continuation paragraph.

In Column 4, Line 23, delete "in the" and insert -- in --, therefor.

Signed and Sealed this
Twenty-sixth Day of January, 2016

Michelle K. Lee
*Director of the United States Patent and Trademark Office*